United States Patent
Furukawa et al.

(10) Patent No.: US 9,093,349 B2
(45) Date of Patent: Jul. 28, 2015

(54) SOLID-STATE IMAGING APPARATUS

(75) Inventors: Tomoyasu Furukawa, Ome (JP); Satoshi Sakai, Yokohama (JP); Yusuke Nonaka, Tachikawa (JP); Shinya Sugino, Akishima (JP)

(73) Assignee: Hitachi, Ltd., Tokyo (JP)

( * ) Notice: Subject to any disclaimer, the term of this patent is extended or adjusted under 35 U.S.C. 154(b) by 81 days.

(21) Appl. No.: 13/547,452

(22) Filed: Jul. 12, 2012

(65) Prior Publication Data

US 2013/0049156 A1 Feb. 28, 2013

(30) Foreign Application Priority Data

Aug. 29, 2011 (JP) ................... 2011-185464

(51) Int. Cl.
*H01L 29/49* (2006.01)
*H01L 27/146* (2006.01)

(52) U.S. Cl.
CPC ...... *H01L 27/14689* (2013.01); *H01L 27/1461* (2013.01); *H01L 27/1463* (2013.01); *H01L 27/14607* (2013.01); *H01L 27/14645* (2013.01)

(58) Field of Classification Search
USPC .................. 257/233, 291, E27.133
See application file for complete search history.

(56) References Cited

FOREIGN PATENT DOCUMENTS

| JP | 2004-031878 A | 1/2004 |
|----|---------------|--------|
| JP | 2006-024907 A | 1/2006 |
| JP | 2006-064956 A | 3/2006 |

*Primary Examiner* — Michael Shingleton
(74) *Attorney, Agent, or Firm* — Miles & Stockbridge P.C.

(57) ABSTRACT

In a region of a weak internal electric field, photocharges generated in a region deeper than the photodiode are diffused laterally to lower the sensitivity by photoelectrons flowing into adjacent pixels, etc (crosstalk). An anti-crosstalk layer is disposed in the photodiode forming portion, and between a pixel region and a peripheral circuit region. Crosstalk between a pixel and a pixel or between a pixel region and a peripheral circuit region is decreased to improve the photosensitivity.

6 Claims, 14 Drawing Sheets

SOLID-STATE IMAGING APPARATUS

CLAIM OF PRIORITY

The present application claims priority from Japanese patent application JP 2011-185464 filed on Aug. 29, 2011, the content of which is hereby incorporated by reference into this application.

BACKGROUND

The present invention concerns a solid-state imaging apparatus such as a CMOS sensor or a CCD sensor for obtaining image information and positional information by using a photoelectric conversion effect and it particularly relates to a solid-state imaging apparatus intending to reduce optical crosstalk by improvement in a well structure.

Solid-state imaging apparatus represented by CMOS sensors and CCD sensors have been applied generally to video cameras, digital still cameras, etc. In the solid-state imaging apparatus using the CMOS sensor, a CMOS transistor is used as a switching device for selecting photoelectric conversion devices (photodiode PD) or a switching device for reading signal charges. Further, an MOS transistor or CMOS transistor is used for peripheral circuits such as a control circuit and a signal processing circuit, and the apparatus have an advantage capable of manufacturing photoelectric conversion device PD, and the switching device, the peripheral circuits, etc. on one identical chip in a series of procedures.

In the solid-state imaging apparatus, a plurality of pixels each provided with a photoelectric conversion device are arranged on a semiconductor substrate. Light incident on each of the pixels is photoelectrically converted by the photodiode to form and collect electric charges, the charges are transferred to a floating diffusion (FD) part, and the potential fluctuation in the FD part is detected by an MOS transistor and converted into electric signals, which are amplified and outputted as video signals.

The photoelectric conversion device PD is formed of a PN junction and, generally electric charges are collected by utilizing an electric field in a depletion layer generated by application of a voltage. In a solid-state imaging apparatus for an incident light in a visible light region (380 nm to 830 nm), most of incident light is absorbed in a depth of about 5 μm from the Si surface to generate photocharges in the charge collection system. Accordingly, for collecting photocharges generated at high efficiency, it is necessary to ensure a sufficient width of the depletion layer, for example, of about 5 μm. Therefore, it is necessary to increase the depth of the PN junction and increase the voltage. Japanese Unexamined Patent Application Publication No. 2004-031878 discloses an example of such technique.

SUMMARY

For improving the photosensitivity, photoelectrically converted photocharges for the depth up to 5 μm region have to be introduced efficiently into a photoelectronic conversion device PD and read out.

Deepening of PN junction as in Japanese Unexamined Patent Application Publication No. 2004-031878 is disadvantageous for the size-reduction of MOS transistor for switching on and off the charge transfer in a photoelectronic conversion device PD. Further, enlargement in the size of the MOS transistor by deepening the PN junction involves a problem of decreasing the aperture ratio of the photoelectronic conversion device PD and lowering the photosensitivity. Further, increase in the voltage results in a problem of increasing the consumption of power.

Japanese Unexamined Patent Application Publication No. 2006-024907 discloses an example of a configuration of collecting electric charges by utilizing an internal electric field due to difference of impurity concentration between a photodiode PD and the substrate of an opposite conduction type without deepening the PN junction, thereby improving the sensitivity and decreasing the power consumption. However, when electric charges are collected by utilizing the internal electric field due to the difference of the impurity concentration, a sufficient concentration gradient cannot be ensured for photoelectrons generated in a region deeper than the photodiode PD, and the photoelectrons diffuse laterally in a region of weak internal electric field to lower the sensitivity by inflow of photoelectrons flowing into adjacent pixels (crosstalk).

According to an aspect of the invention, crosstalk is decreased to improve the sensitivity by providing a structure for absorbing electric charges and leading photocharges to a photodiode PD in a region where a concentration gradient cannot be sufficiently ensured.

A solid-state imaging apparatus having a pixel region and a logic circuit region adjacent to the pixel region and having a logic circuit formed therein includes: a first conduction type semiconductor layer in which the pixel region and the logic circuit region are formed, a first conduction type first semiconductor region at a concentration higher than that of the semiconductor layer and formed over the semiconductor layer, and a device isolation region for isolating a device in the pixel region and a device in the logic circuit region, in which a second conduction type photodiode is formed over the first semiconductor region in the pixel region, and a second conduction type second semiconductor region extending from the photodiode exceeding the first semiconductor region to the semiconductor layer is formed in the second conduction type photodiode region.

In a preferred embodiment, a second conduction type third semiconductor layer extending from an oxide film forming the device isolation region exceeding the first semiconductor region into the semiconductor layer is formed in the device isolation region.

Crosstalk can be decreased to improve the sensitivity by providing a structure for absorbing electric charges and introducing photocharges to the photodiode PD, separately from the photodiode PD in a region where sufficient concentration gradient cannot be obtained and the internal electric field is weak.

Since the structure can be formed irrespective of the structure of the MOS transistor and the photodiode PD, this provides an advantage of improving the sensitivity and saving the consumption of power simultaneously.

DETAILED DESCRIPTION

Figure 3:
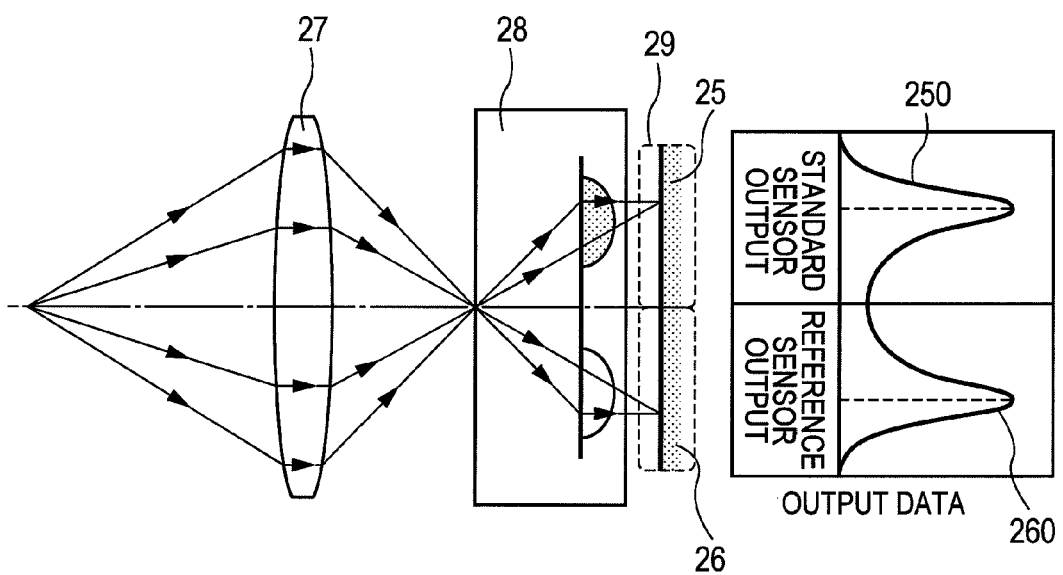
FIG. 3 is a principle view of an auto-focus sensor.

Preferred embodiments of the invention are to be described specifically for an auto-focus sensor using a CMOS sensor as an example. At first, the principle of an auto-focus sensor is described with reference to FIG. 3. A light beam passing through an imaging lens 27 is processed by a secondary focusing optical system 28 and an object image is re-focused to two positions on a standard sensor array 25 and a reference sensor array 26 of an auto-focus sensor 29. A defocusing amount is determined by detecting phase difference between a sensor output 250 obtained from the object image on the standard sensor array 25 and a sensor output 260 obtained from the object image on the reference sensor array 26. The principle of the auto-focus sensor is described, for example, in Japanese Unexamined Patent Application Publication No. 2006-64956.

Figure 1:
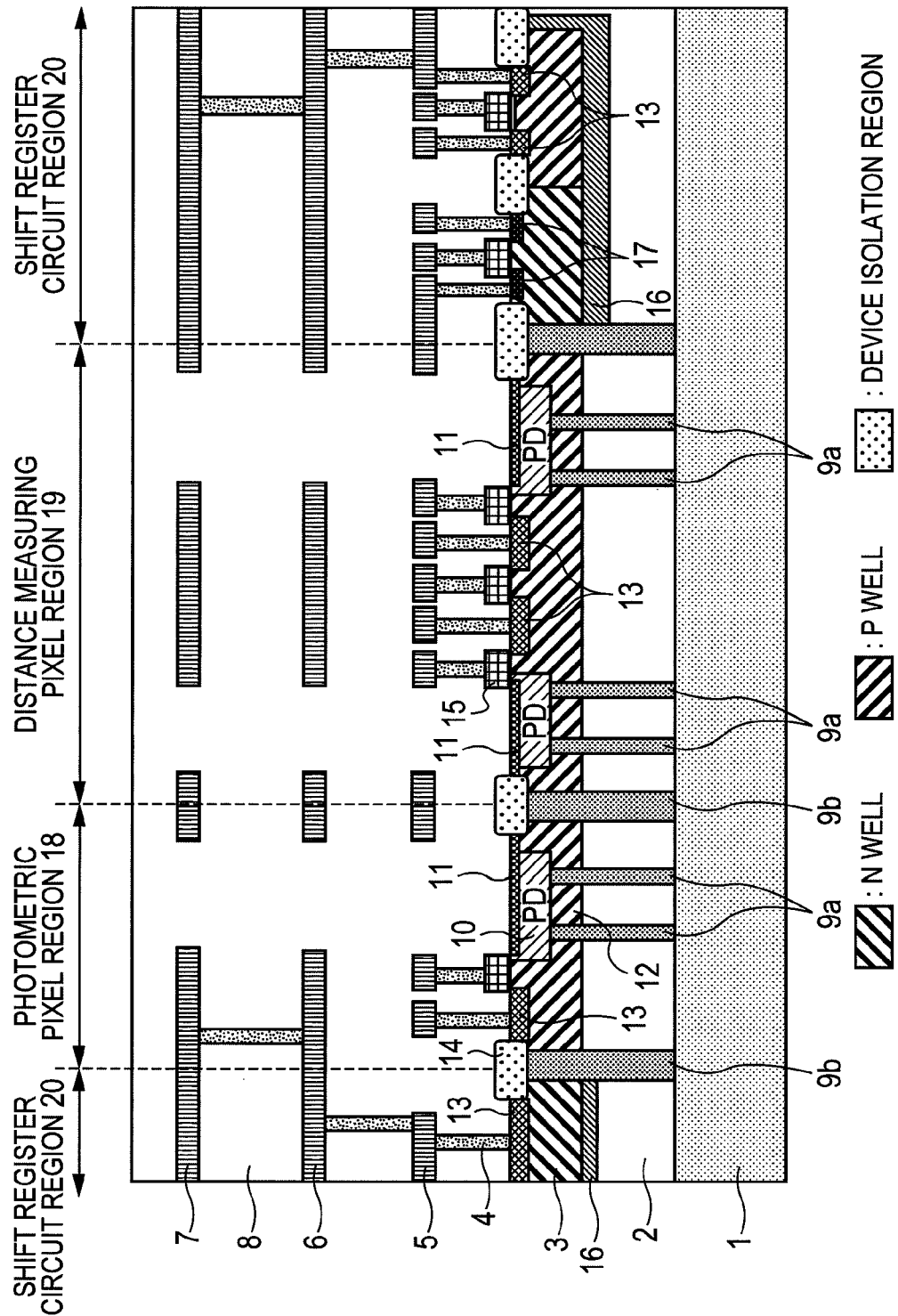
FIG. 1 is a cross sectional view for a main portion of a solid-state imaging apparatus according to the invention.
Figure 2:
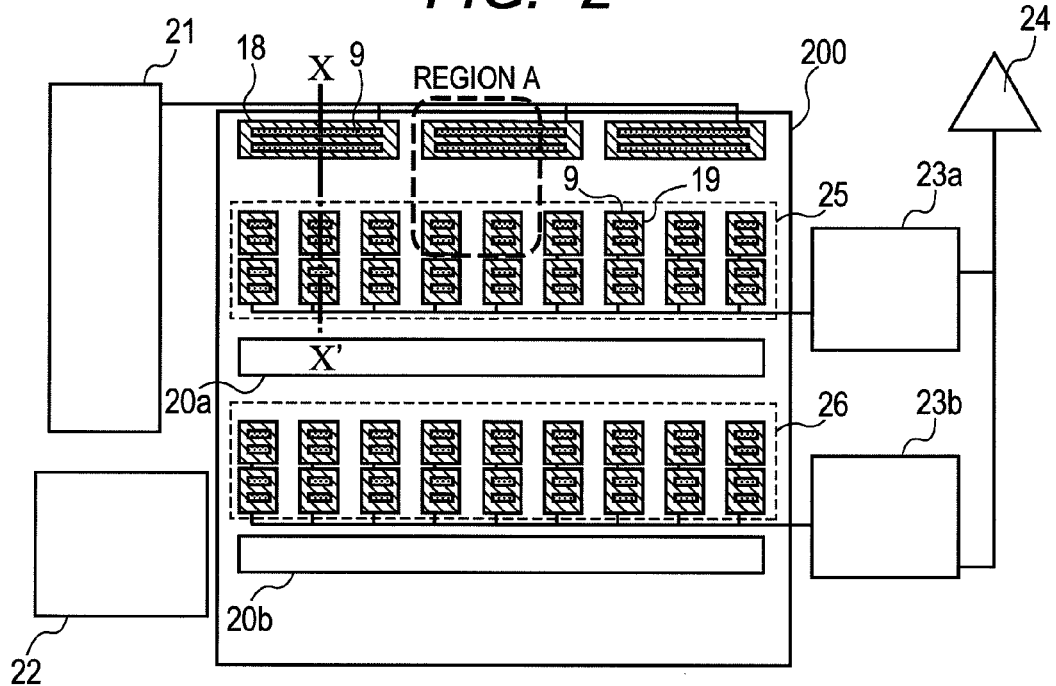
FIG. 2 is a configurational view of an auto-focus sensor using a CMOS sensor to which the invention is applied.

FIG. 2 is an entire configurational view of applying the invention to the auto-focus sensor using the CMOS sensor. In FIG. 2, a sensor device 200 and peripheral circuits thereof are schematically shown. Each of pixel regions shown in FIG. 2 is represented by a planar shape of the photodiode PD thereof. In the sensor device 200, a photometric pixel region 18 for measuring the brightness of an object and a distance measuring pixel region 19 for measuring a focusing position are arranged in a two-dimensional manner. An anti-crosstalk layer 9 is disposed to the photodiode PD in the photometric pixel region 18 and the distance measuring pixel region 19. This is a feature of this embodiment, details of which are to be described with reference to FIG. 1. Further, there are two arrays comprising distance measuring pixels, that is, a standard sensor array 25 and a reference sensor array 26. For detecting the phase difference based on the outputs from the standard sensor array 25 and the reference sensor array 26 as has been described with reference to FIG. 3, the apparatus has shift register circuits 20a, 20b for scanning respective sensor arrays, column signal processing circuits 23a, 23b for amplifying signals from the respective sensor arrays, and an output circuit 24 for amplifying the combined output from the column signal processing circuits and outputting the same to the outside. Further, the apparatus also has a photometric signal processing circuit 21 for processing signals of the photometric pixel region 18 and a control circuit 22 for controlling the anti-focus sensor as the peripheral circuit.

FIG. 1 shows a cross sectional structure for a main portion of a solid-state imaging apparatus. For the configuration shown in FIG. 2, FIG. 1 corresponds to a cross section along X-X' in FIG. 2. The imaging apparatus in this embodiment has three interconnect layers. P⁻ Si layer 2 is formed on a P⁺ Si semiconductor substrate 1 by using an epitaxial growing technique. Then, device isolation regions 14 each comprising an insulator (usually formed of an oxide film) are formed and P wells 12 and N wells 3 are formed by adding a P type impurity and an N type impurity. The P well 12 is formed at an impurity concentration higher than that of the P⁻ Si layer 2. Further, for electrically isolating the P wells at different potentials, an N type isolation NISO 16 is formed. Then, an N type impurity is added over the P well 12 and the P⁻ Si layer 2 to form an anti-crosstalk layer (deep N well layer DNW) 9. The anti-crosstalk layer DNW 9 is short circuited to the N well 3 or the photodiode 10 to function so as to absorb photoelectrons as described later. By arranging the anti-crosstalk layer DNW 9b at the boundary between the pixel regions 18, 19 and the peripheral circuit region 20 as in this embodiment an advantage of simplifying a power supply region and decreasing the area of arrangement of the anti-crosstalk layer DNW 9b can be provided. Although not shown in FIG. 1, the anti-crosstalk layer DNW 9b between the pixel regions 18 and 19 is connected, for example, with the anti-crosstalk layer DNW 9b at the boundary between the pixel region 18 and the peripheral circuit region 20, and photoelectrons are absorbed by way of the anti-crosstalk layer DNW 9b to the N well 3. The boundary between the P⁺ Si semiconductor substrate 1 and the P⁻ Si layer 2 is present at a position about of 5 μm from the Si surface in the direction of the depth.

As the subsequent step, a gate electrode 15, and impurity regions 10, 11, 13, and 17 are formed. The impurity region 10 is an N type photodiode PD, the impurity region 11 is a P type protective layer for the surface of photodiode PD. Further, the impurity region 13 is an N⁺ diffusion layer and the impurity layer 17 is a P⁺ diffusion layer. In the pixel regions 18 and 19, a pixel-forming transistor is formed by the impurity region and the gate electrode. In the circuit region 20, a transistor forming the peripheral circuit is formed by the impurity region and the gate electrode. The peripheral circuit is provided, for example, as a CMOS logic circuit.

Over the photodiode PD and the gate electrode 15, a first interconnect layer 5 is formed by way of an interconnect layer insulation film 8. A second interlayer 6 and a third interconnect layer 7 are formed successively thereover. They are connected electrically to each other by way of contact holes 4.

This configuration is an example and is not restricted to the forming method described above. Further, while the photodiode PD is an N type, the substrate 1 is a P type, and a deep impurity layer 9 forming a photocharge collection region is an N type, respective conduction types may be reversed. That is, the structure can be formed in the same manner also by forming the photodiode PD as the P type, the substrate 1 as the N type, and the deep impurity layer 9 forming the photocharge collection region as P type.

According to the invention, crosstalk between a pixel region and a pixel region, and between a pixel region and a peripheral circuit region is decreased to improve the photosensitivity by disposing the anti-crosstalk layer DNW 9 between the photodiodes PD and between the pixel region and the peripheral circuit (shift register circuit in the embodiment of FIG. 1). The effect of greatly decreasing the crosstalk and improving the photosensitivity is to be described specifically with reference to an example where light is incident on the photometric pixel region 18.

Figure 4:
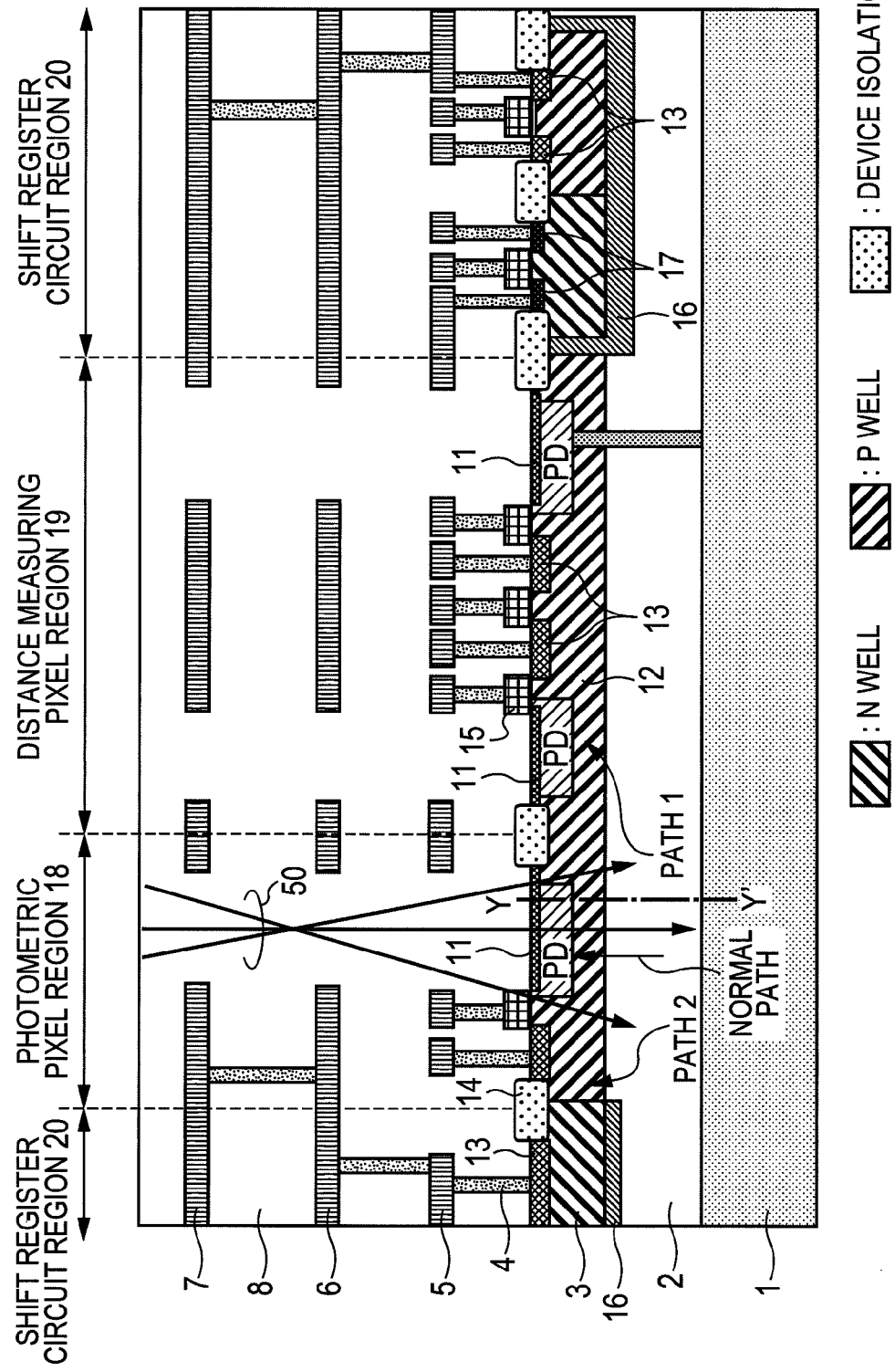
FIG. 4 shows a comparative embodiment showing photocharge transfer paths in a cross sectional view for a main portion of a solid-state imaging apparatus not having an anti-crosstalk layer.
Figure 5:
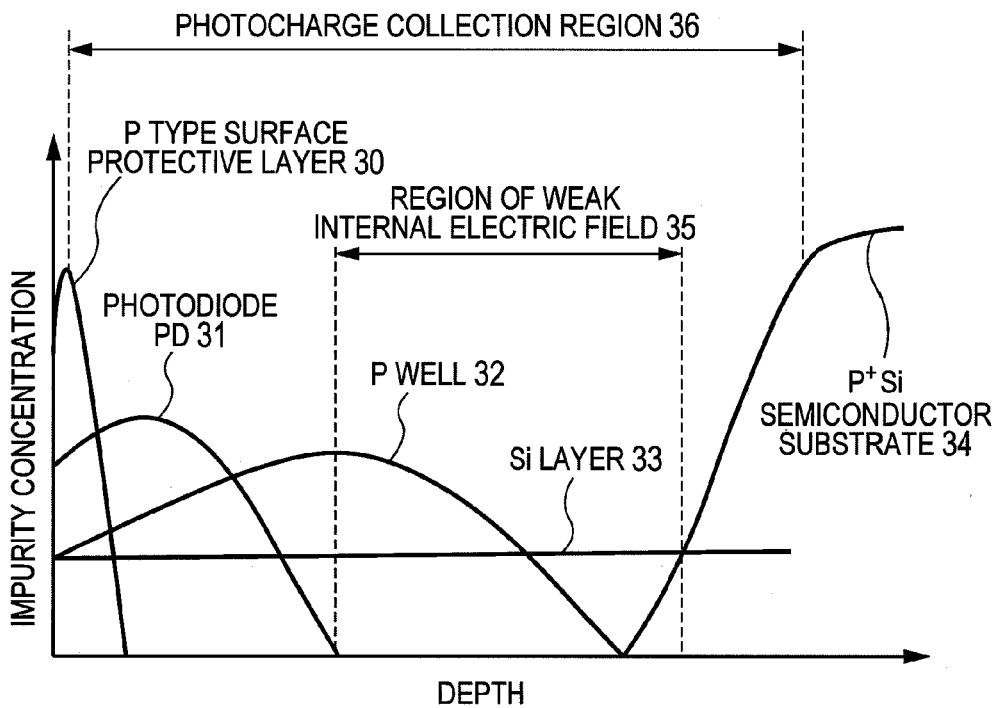
FIG. 5 shows an impurity profile in the direction Y-Y' in FIG. 4.
Figure 6:
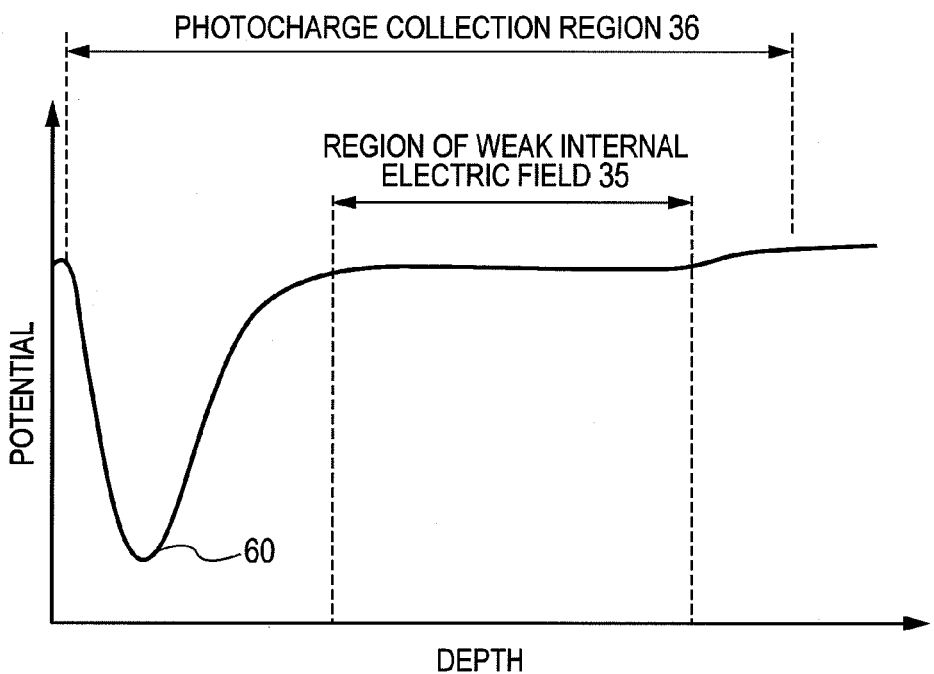
FIG. 6 is a potential diagram in the impurity profile shown in FIG. 5.

As a comparative embodiment, FIG. 4 shows a cross sectional structure having no anti-crosstalk DNW 9 (corresponding to FIG. 1) with components having identical configuration as those in FIG. 1 being designated by the same reference numbers). FIG. 4 also shows photocharge transfer paths when light 50 is incident on the photometric pixel region 18. FIG. 5 shows an impurity profile in the direction Y-Y' in the photodiode PD in FIG. 4, and FIG. 6 shows a potential diagram in the impurity profile shown in FIG. 5.

As shown in FIG. 5, in the photodiode PD, a region over the P$^+$ Si conductor substrate 1 functions as a photocharge collection region 36. There are shown an impurity profile 30 for the P type protective layer 11, an impurity profile 31 for the N type photodiode 10, an impurity profile 32 for the P well 12, an impurity profile 33 for the P$^-$ Si layer 2, and an impurity profile 34 for the P$^+$ Si semiconductor substrate 1. In this case, a region 35 of a weak internal electric field comprising the P well 12, the P$^-$ Si layer 2, and the P$^+$ Si semiconductor substrate 1 is formed. FIG. 6 shows the state. Although the potential is minimum at 60 in the N type impurity region forming the photodiode PD, no sufficient potential gradient can be ensured in a region 35 of weak internal electric field. As a result, photocharges reaching the deep region of the sensor device cannot be transferred efficiently to the region 60 of the photodiode PD. That is, since the potential gradient in the longitudinal direction of the device is weak, photocharges are diffused laterally before reaching the photodiode PD. As a result, the light 50 incident on the photometric pixel region causes crosstalk to the distance measuring pixel region 19 as shown by the path 1 in FIG. 4, the photosensitivity of the photometric pixel 18 is lowered, and photocharges are observed as false signals in the distance measuring pixel 19. Further, since a portion of the photocharges generated by the incident light 50 causes crosstalk to the shift register circuit region 20 as shown by the path 2 in FIG. 4, the photosensitivity of the light measuring element 18 is also lowered.

Figure 7:
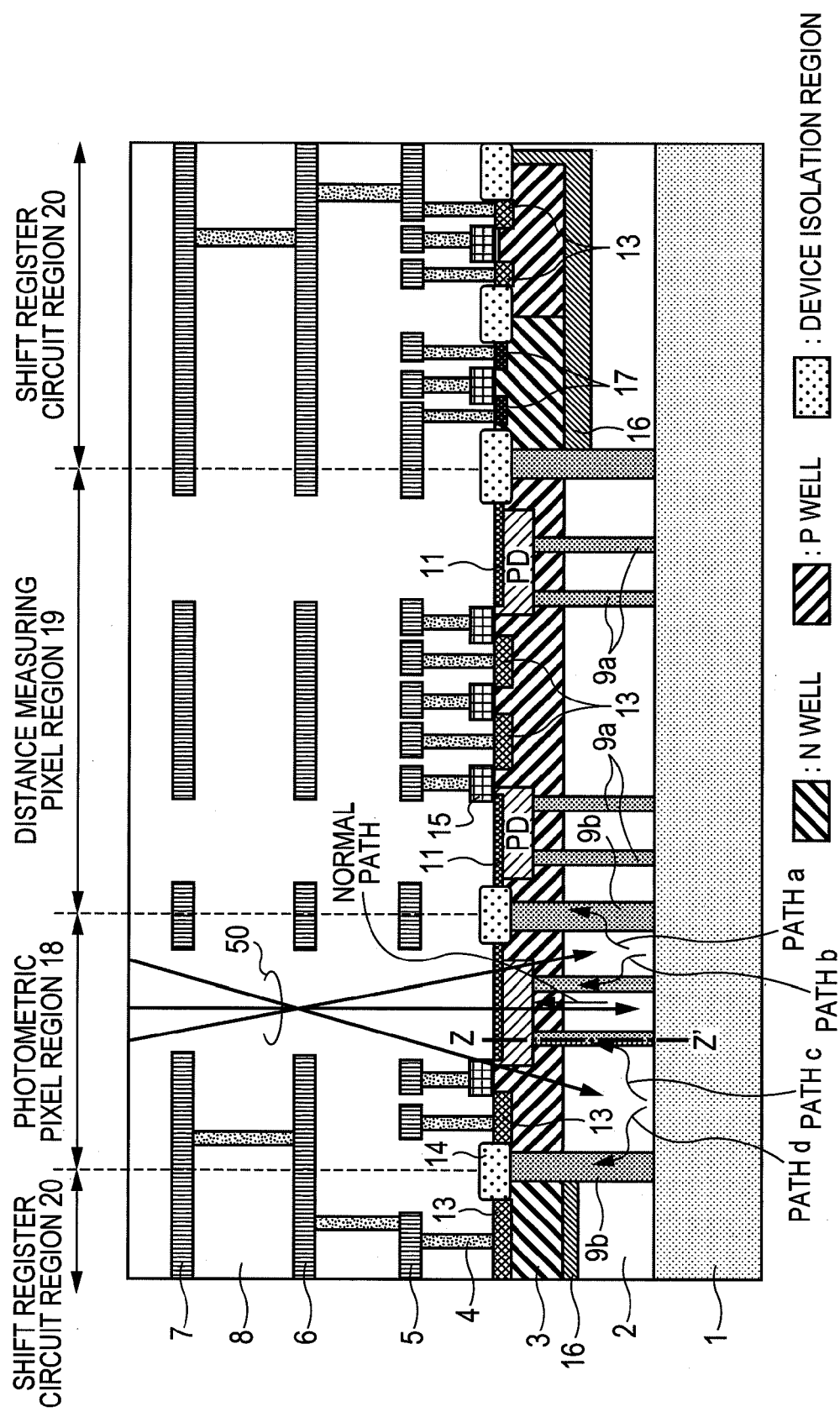
FIG. 7 is a view showing photocharge transfer paths in a cross sectional view for a main portion of a solid-state imaging apparatus of Embodiment 1.
Figure 8:
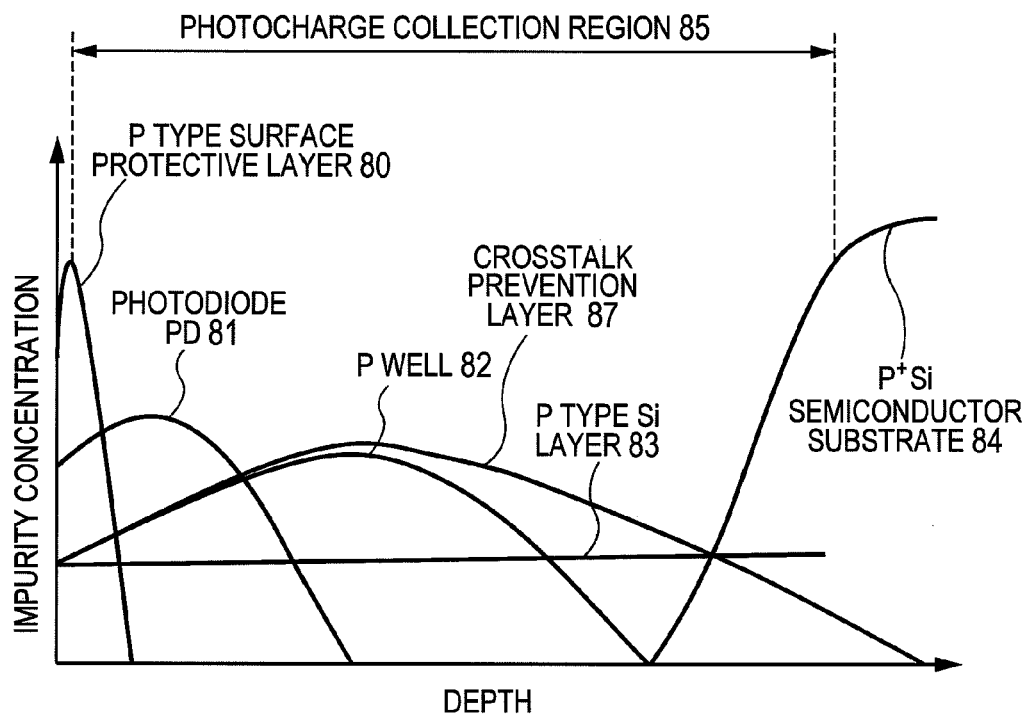
FIG. 8 shows an impurity profile in a direction Z-Z' in FIG. 7.
Figure 9:
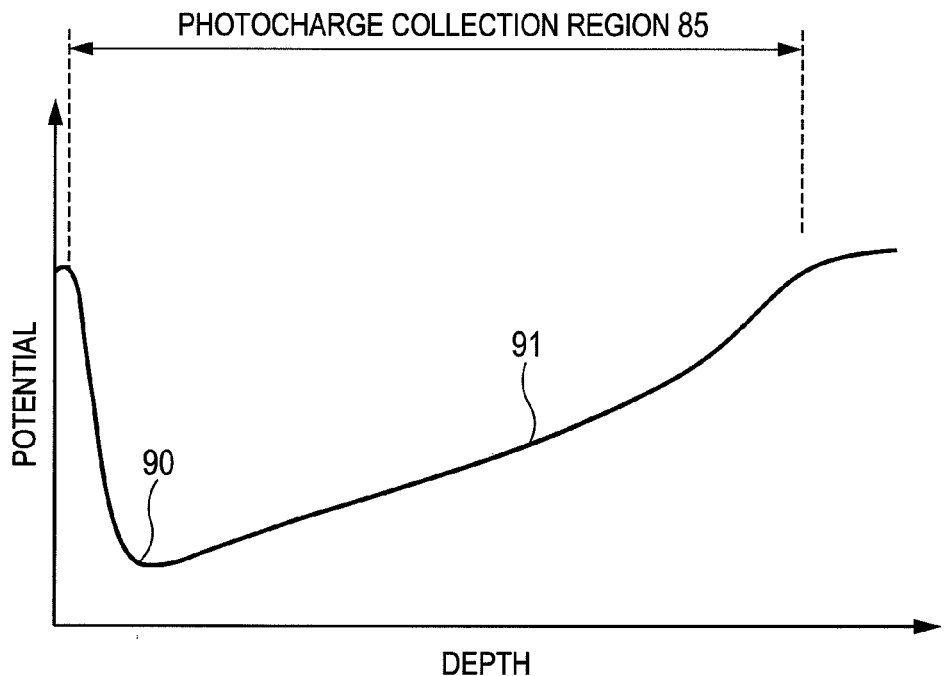
FIG. 9 is a potential diagram in the impurity profile (anti-crosstalk layer DNW) in FIG. 8.

In contrast, FIG. 7 shows the photocharge transfer path when the light 50 is incident on the photometric pixel 18 in FIG. 1, FIG. 8 shows an impurity profile in the direction Z-Z' in an anti-crosstalk layer DNW 9a disposed to the photodiode PD in FIG. 7, and FIG. 9 shows a potential diagram in the impurity profile shown in FIG. 8.

As shown in FIG. 8, in the photodiode PD, a region over the P$^+$ Si semiconductor substrate 1 functions as a photocharge collection region 85. There are shown an impurity profile 80 of the P type surface protective layer 11, an impurity profile 81 of the N type photodiode 10, an impurity profile 82 of the P well 12, an impurity profile 83 of the P$^-$Si layer 2, an impurity profile 84 of a P$^+$ Si semiconductor substrate 1, and an impurity profile 87 of the anti-crosstalk layer DNW 9. A potential gradient having a gradient substantially over the entire photocharge collection region 85 as shown in FIG. 9 can be formed by adding an N type impurity of a conduction type identical with that of the photodiode PD, thereby forming an anti-crosstalk layer DNW 9. As a result, in a region of a weak internal electric field comprising the P-well 12, the P$^-$ Si layer 2, and the P$^-$ Si semiconductor substrate 1, photocharges diffusing in the lateral direction are transferred in a vertical direction through the anti-crosstalk layer DNW 9. For the light 50 incident on the photometric pixel 18, charges can be collected to the photodiode PD 10 as in the path b and path c in FIG. 7 with no crosstalk to the distance measuring pixel region 19 or the shift register circuit region 20. As a result, the photosensitivity of the photometric pixel 18 is improved. In the distance measuring pixel region 19, since charges are absorbed by the anti-crosstalk layer DNW 9b as shown by the path a in FIG. 7, they are not observed as false signals. Further, a portion of the photocharges generated by the incident light is absorbed by the anti-crosstalk layer DNW 9b disposed between the photometric pixel 18 and the shift register region 20 as in the path d shown in FIG. 7 and does not flow into the shift register circuit region 20.

While the effect of the anti-crosstalk layer DNW has been described with respect to the photometric pixel 18, crosstalk can be decreased as a matter of fact also in the case where light is incident on the distance measuring element 19, to improve the photosensitivity by the same reason.

Figure 10:
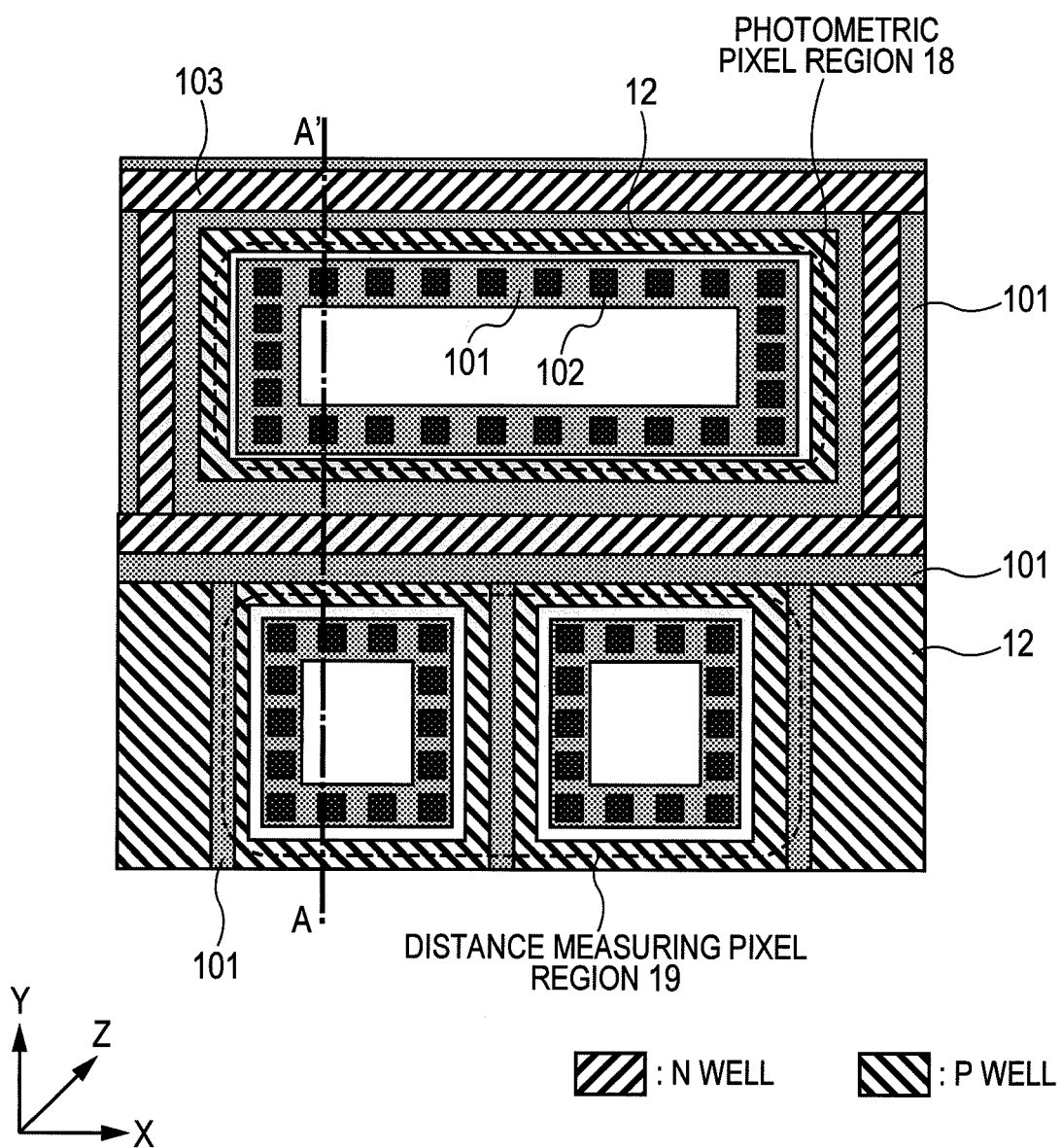
FIG. 10 is an upper plan view for a main portion of a photometric pixel region 18 and a distance measuring pixel region 19 in a region A shown in FIG. 2 (first embodiment)
Figure 11:
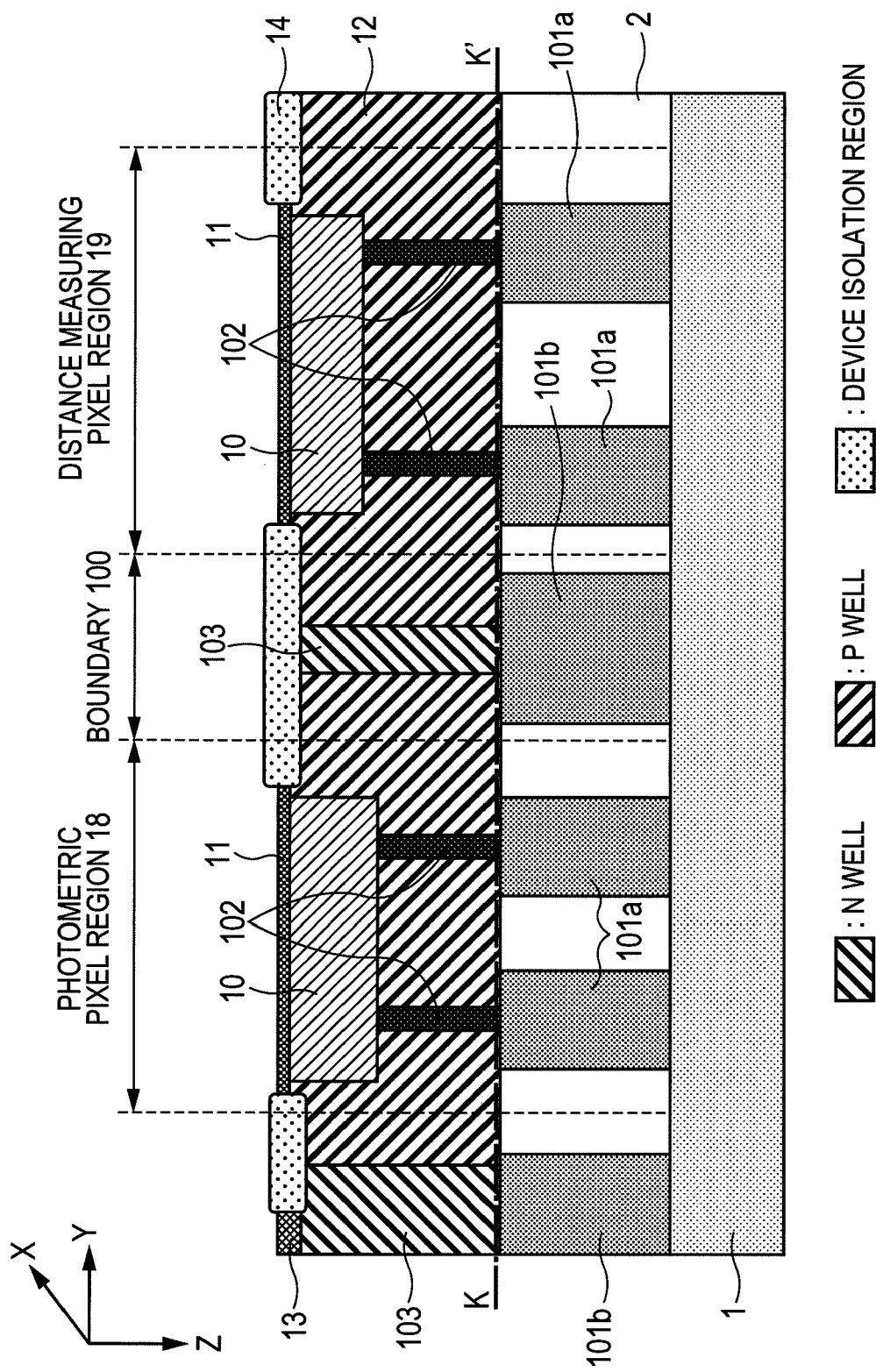
FIG. 11 is a cross sectional structure along line A-A' in FIG. 10.

A pixel structure to which the first embodiment of the anti-crosstalk layer DNW for improving the photosensitivity is applied will now be described. FIG. 10 is an upper plan view for a main portion of a photometric pixel region 18 and a distance measuring pixel region 19 corresponding to the region shown as the region A in FIG. 2 (cross section along K-K' shown in FIG. 11) and FIG. 11 shows a cross sectional structure along A-A' in FIG. 10. In this embodiment, with pillar shape anti-crosstalk layer DNW 9, the impurity profile shown in FIG. 8 is formed by use of an N well DNWa 101 in a deep region and an N well DNWb 102 in a shallow region by applying different masks and ion implantation respectively. The N well DNWa 101 in the deep region is disposed as a ring-shape in the pixel boundary region and in each of the pixels. In this embodiment, an N well 103 is arranged over the N well DNWa 101b in the deep region of the pixel boundary 100 so as to apply a potential that absorbs photocharges causing crosstalk. The N wells DNWa 101b in the deep region of the pixel boundary region are connected to each other, although not illustrated, and applied with a positive voltage by way of an impurity region 13 and the N well 103 as the power supply region. For example, a positive voltage identical with a power source voltage is applied to the N well DNWa 101b in the deep region of the pixel boundary region by way of the power supply region to absorb photocharges having a negative potential.

On the other hand, an N well DNWb 102 in the shallow region is formed as a dot shape over the N well DNWa 101a in the deep region arranged in the ring shape to the photometric pixel 18 and the distance measuring pixel 19. The N well DNWb 102 in the shallow region is connected to the photodiode PD 10 and transfers the photocharges generated in the pixel to the photodiode PD. For efficiently transferring the photocharges generated in the pixel to the photodiode, it is necessary to form a potential gradient from the deep portion of the anti-crosstalk layer 9 to the photodiode 10. That is, it is necessary to design such that the potential is lower in the order of the photodiode 10, the N well DNWb 102 in the shallow region, and the N well DNWa 101a in the deep region.

The potential of the N well DNWa 101a in the deep region is formed at a position between the P$^+$ Si semiconductor substrate 1 and the P well 12, and the potential can be designed by utilizing the direction of the depth in FIG. 11. That is, since the PNP junction is formed in the vertical direction (direction Z) by the N well DNWa 101a in the deep region sandwiched between the P$^+$ Si semiconductor substrate 1 and the P well 12, it is possible to control the potential of the N well DNWa 101a in the deep region and design the potential gradient so as to decrease from the deep region of the N well DNWa 101*a* to the photodiode 10. Further, when the N well DNWa 101*a* in the deep region is arranged as the ring shape, since the electric field effect in the directions X and Y in FIG. 11 can be utilized (that is, PNP junction is formed also in the direction X or the direction Y by forming the DNW as the ring shape), the N well DNWa 101*a* in the deep region can be depleted at a high potential to facilitate the potential design. Further, the N well DNWb 102 in the shallow region is formed at the position near the deep region of the P well 12, and the potential is designed so as to attain depletion by using the PN junction of the P well 12 and the N well DNWb 102 in the shallow region. For example, the N well DNWb 102 in the shallow region is formed such that the density is slightly increased along the impurity distribution of the P well 12. In this case, when the N well DNWb 102 in the shallow region is arranged dotwise, depletion can be attained by utilizing the electric field effect from the directions X and Y in FIG. 11 to facilitate the potential design.

Further, in the embodiment shown in FIG. 10 and FIG. 11, the N well DNWa 101 in the deep region and the N well DNWb 102 in the shallow region are arranged at the outermost periphery of each of the pixels. With such an arrangement, it is possible to collect photocharges generated by the light incident into the pixels over a wide range and improve the sensitivity.

Figure 12:
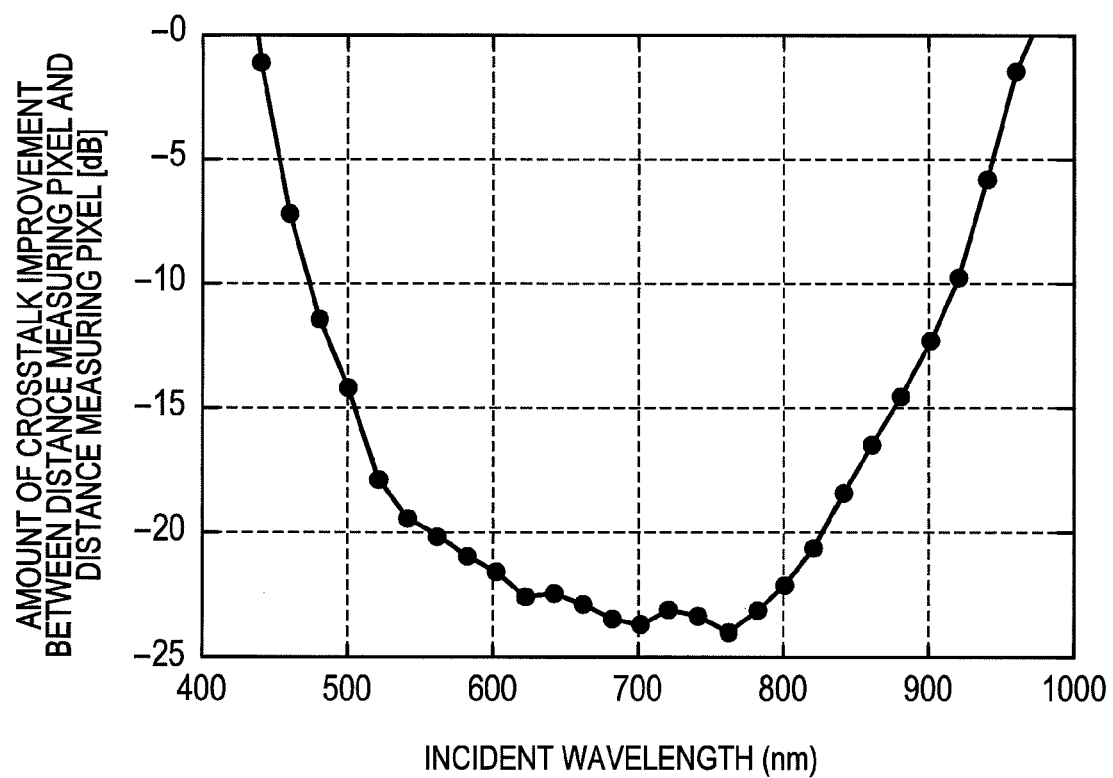
FIG. 12 is a view showing a crosstalk effect between distance measuring pixel and distance measuring pixel.

When the first embodiment of the anti-crosstalk layer DNW is applied, the photosensitivity was improved by 1.7 times, and the crosstalk between the photometric pixel and the distance measuring pixel and the crosstalk between the distance measuring pixel and the distance measuring pixel were improved by −20 dB or more. FIG. 12 shows the crosstalk effect between the distance measuring pixel and the distance measuring pixel when this embodiment is applied. An improvement of −20 dB or more was obtained in a region at wavelength from 500 nm to 800 nm that corresponds to a visible light.

Figure 13:
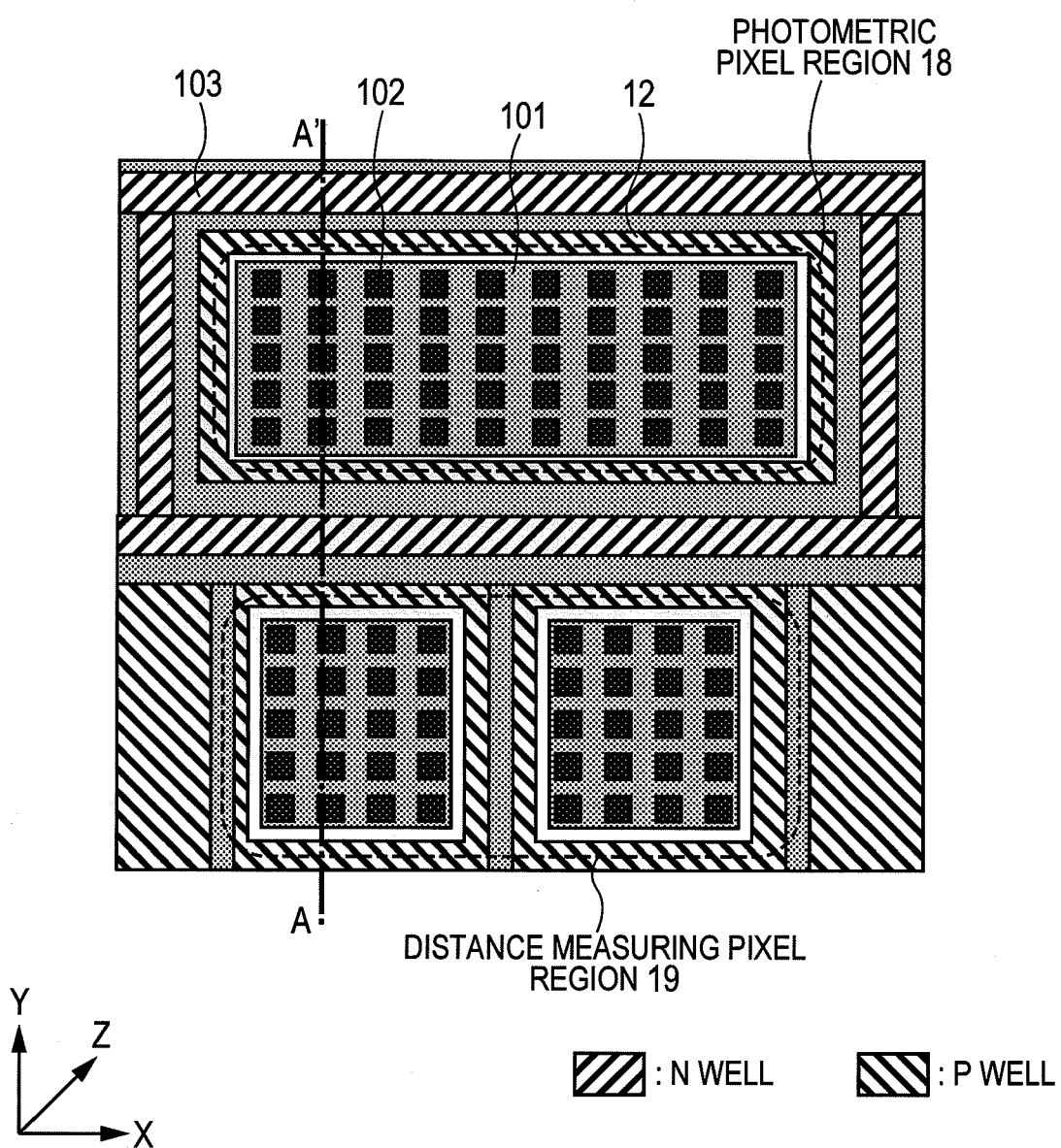
FIG. 13 is an upper plan view for a main portion of a photometric pixel region 18 and a distance measuring pixel region 19 in a region A shown in FIG. 2 (second embodiment)
Figure 14:
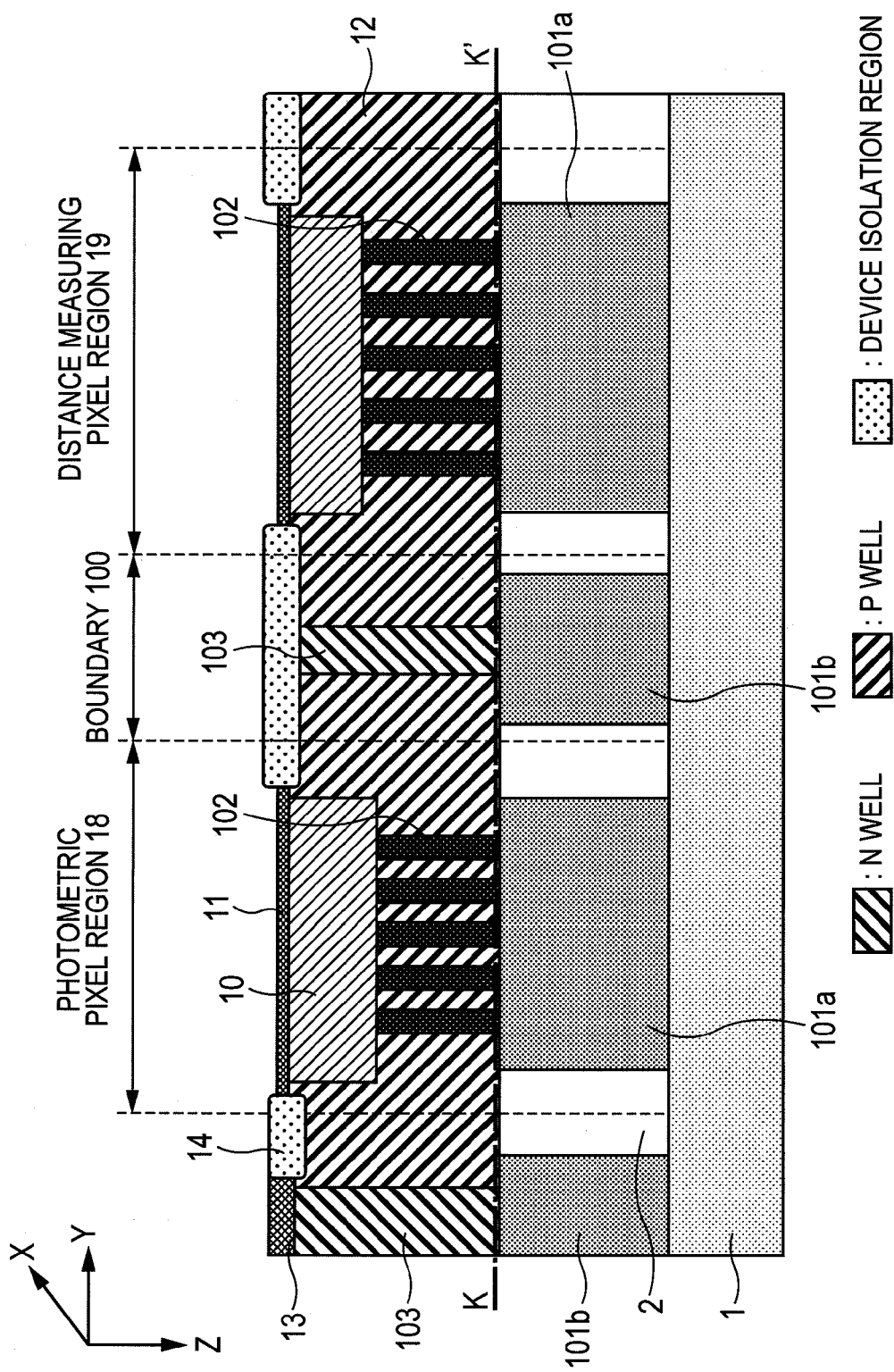
FIG. 14 is a cross sectional structure along line A-A' in FIG. 13.

Next a pixel structure to which a second embodiment of the anti-crosstalk layer DNW is applied is to be described. FIG. 13 is an upper plan view of a main portion of a photometric pixel region 18 and a distance measuring pixel region 19 corresponding to a region shown as the region A in FIG. 2 (cross section along K-K' shown in FIG. 14) and FIG. 14 shows a cross sectional structure along A-A' in FIG. 13. When compared with the first embodiment, the second embodiment has a feature that the N well DNWa 101 in the deep region in the photometric pixel 18 and the distance measuring pixel 19 are arranged as a planar shape over the entire region in respective pixels, and dot-shaped N well DNWb 102 in the shallow region are arranged over the entire region in the pixel.

In this embodiment, photocharges generated in the deep region in the pixel are transferred by way of the N well DNWa 101 in the deep region and the N well DNWb 102 in the shallow region to the photodiode 10 in the same manner as in the first embodiment. The number of the paths for transferring the photocharges by way of the N well DNWa 101 in the deep region and the N well DNWb 102 in the shallow region to the photodiode PD can be increased compared with the first embodiment, and charges can be transferred at a higher speed and at a higher efficiency. Further, since the charge store region (N type) of the well DNWa 101 in the deep region, the N well 102 in the shallow region, and the photodiode 10 can be increased, the amount of storable signal charges can be increased.

Figure 15:
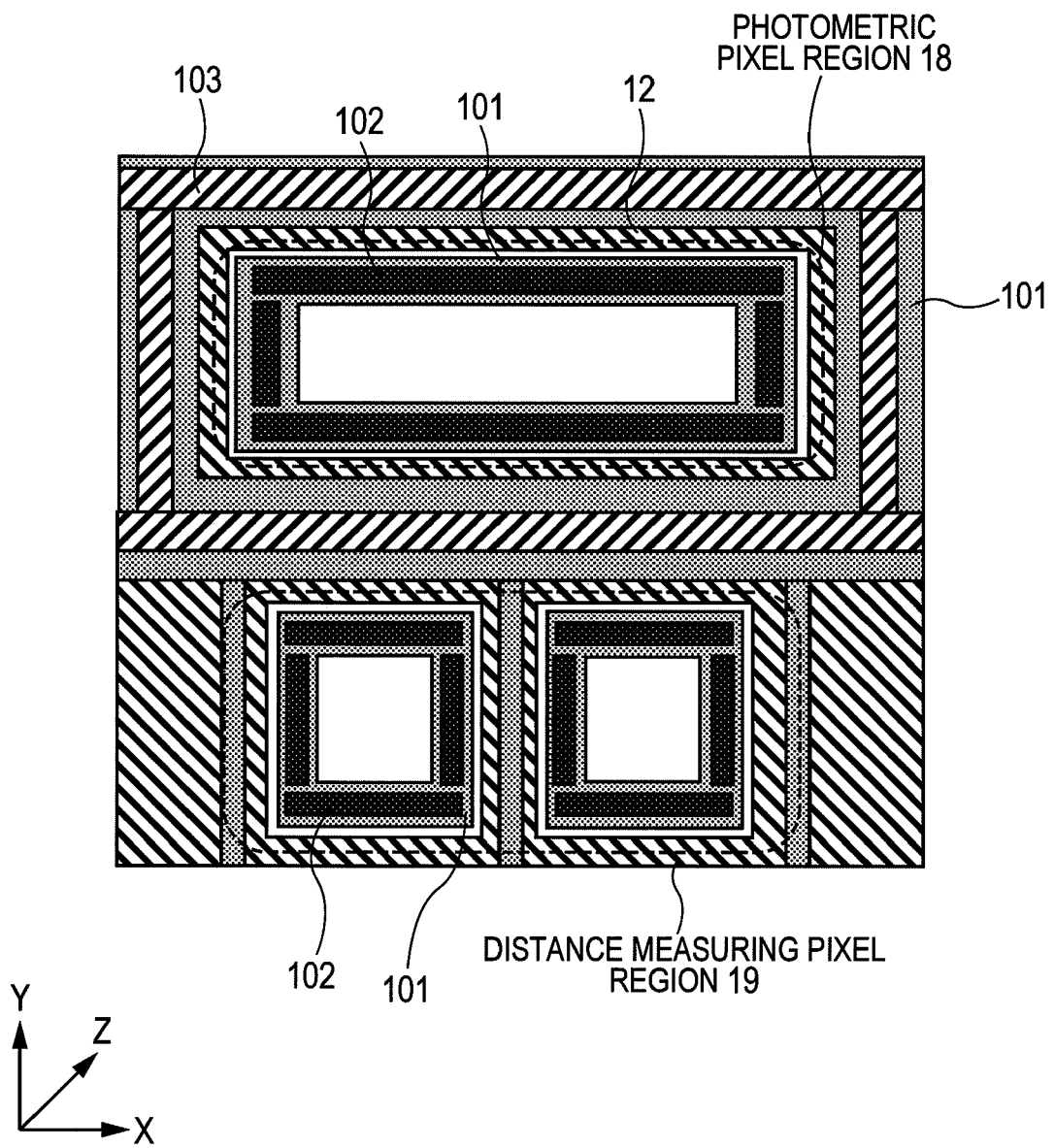
FIG. 15 is an upper plan view for a main portion of a photometric pixel region 18 and a distance measuring pixel region 19 in a region A shown in FIG. 2 (third embodiment)

Further, a pixel structure to which a third embodiment of the anti-crosstalk layer DNW is applied is to be described. FIG. 15 is an upper plan view for a main portion of a photometric pixel region 18 and a distance measuring pixel region 19 corresponding to a region shown as the region A in FIG. 2 (corresponding to the cross section along K-K' shown in FIG. 11). Compared with the first embodiment, this embodiment has a feature that the N well DNWb 102 in the shallow region is formed as a line shape at the outer periphery in the pixel.

In this embodiment, photocharges generated in the deep region in the pixel are transferred by way of the N well DNWa 101 in the deep region and the N well DNWb 102 in the shallow region to the photodiode 10 in the same manner as in the first embodiment. Compared with the first embodiment, since the N well DNWb 102 in the shallow region is formed as the line shape, the photocharges generated in the pixel can be absorbed to the N well DNW without escaping to the outside of the pixel region, and the photosensitivity is improved.

Figure 16:
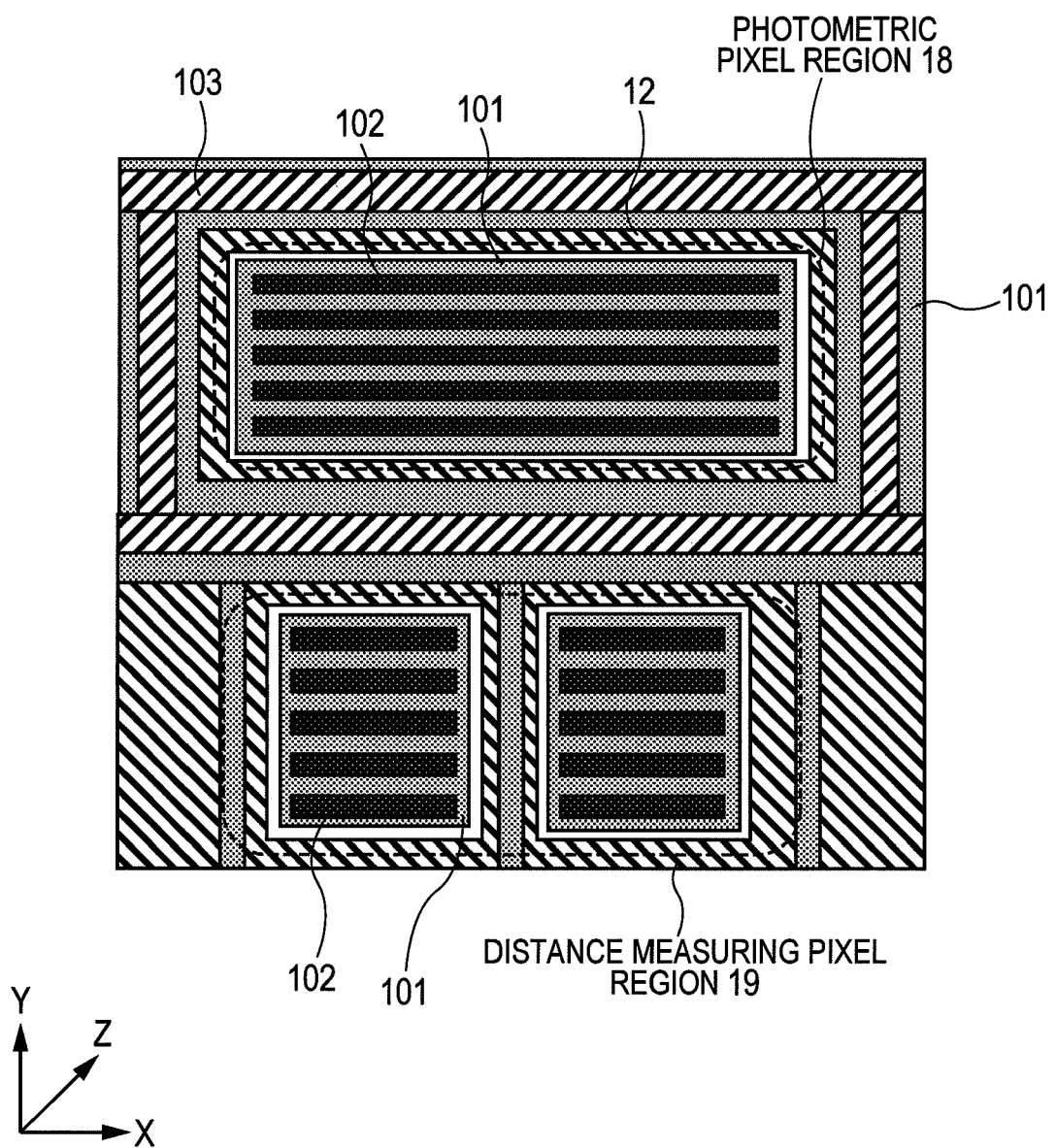
FIG. 16 is a modified embodiment of the embodiment shown in FIG. 15.

Further, as a modified embodiment, when the N well DNWa 101 in the deep region is arranged as a planar shape for the entire region in the pixel and the N well DNWb 102 in the shallow region is arranged as the line shape for the entire region in the pixel in the same manner as in the second embodiment, it is possible to increase the charge transfer speed, improve the efficiency, and increase the amount of storable signal charges. FIG. 16 is an upper plan view for a main portion of a photometric pixel region 18 and a distance measuring pixel region 19, corresponding to a region shown as the region A in FIG. 2, according to this modified embodiment (corresponding to the cross section along K-K' shown in FIG. 11).

Figure 17:
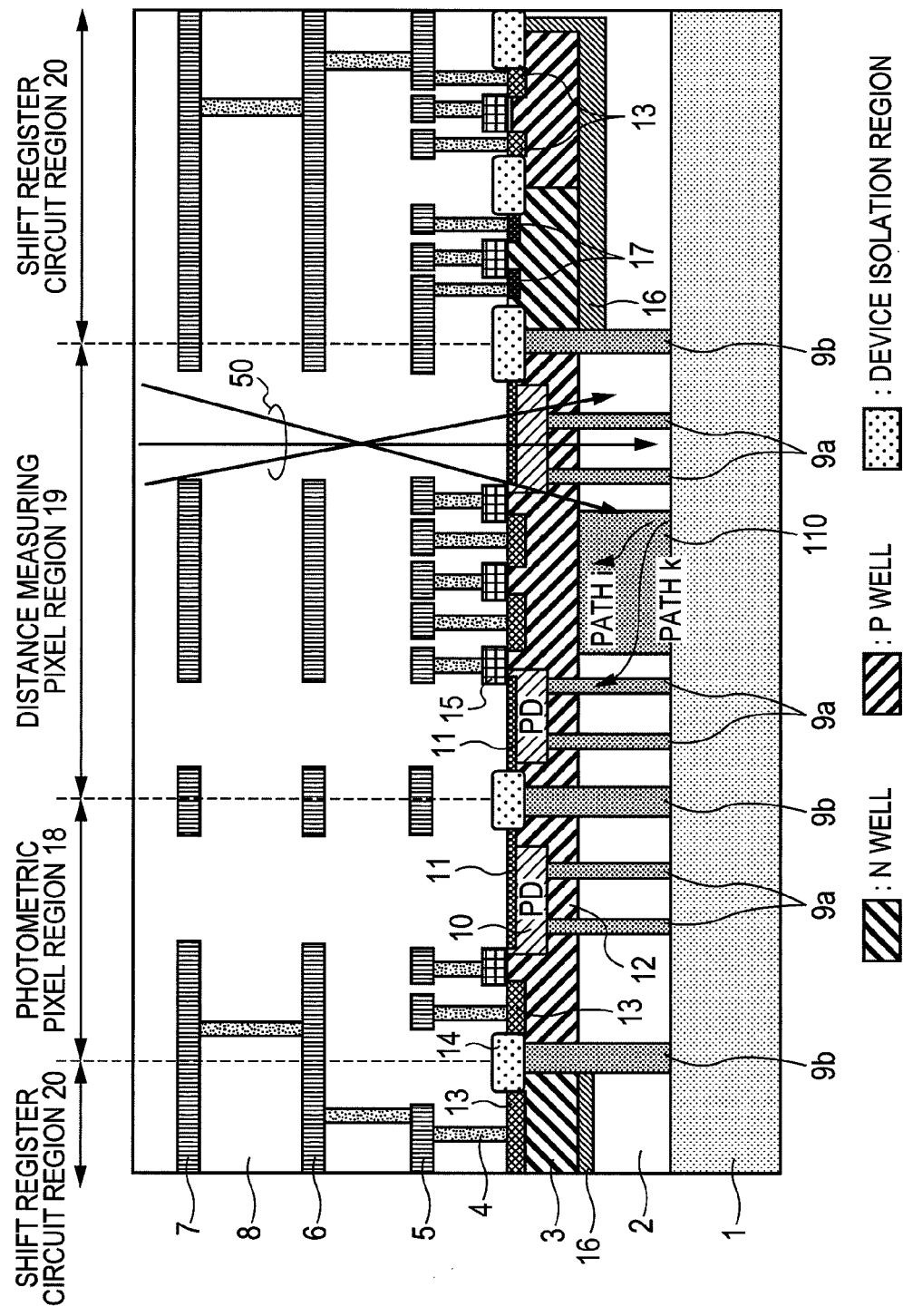
FIG. 17 is a view showing other cross sectional structure for a main portion of the solid-state imaging apparatus according to the invention.

FIG. 17 is a view showing another cross sectional structure for a main portion of a solid-state imaging apparatus of the invention. It has a feature that an additional anti-crosstalk layer DNW 110 (N well in the deep region) is arranged below transistors of the photometric pixel and the distance measuring pixels in addition to those of the first embodiment.

In this structure, light incident on the photometric pixel 18 does not cause crosstalk to the distance measuring pixel region 19 and charges can be absorbed to the photodiode PD 10 in the same manner as in the first embodiment. Accordingly, the photosensitivity of the photometric pixel is improved. Since the charges are absorbed by the anti-crosstalk layer DNW 9, they are not observed as false signals in the distance measuring pixel 19.

When the light is incident on the distance measuring pixel region 19, as shown in FIG. 17, since the anti-crosstalk layer DNW 110 (N well in the deep region) is disposed below the transistor region disposed between the distance measuring pixel, and the distance measuring pixel, a transfer path of photocharges toward the adjacent distance measuring pixel as shown by the path k is not present. As a result, crosstalk between the distance measuring pixel and the distance measuring pixel can be decreased compared with that in the first embodiment. Particularly, the crosstalk decreasing effect is remarkable when the pixel size is reduced and the distance between the distance measuring pixel and the distance measuring pixel is decreased. Thus, even when the size of the pixel is reduced and the distance between the distance measuring pixel and the distance measuring pixel is decreased, size reduction is possible with no deterioration in the amount of crosstalk.

While the description has been made to a case of applying the invention to the auto-focus sensor using the CMOS sensor, the invention is also applicable to other solid-state imaging devices, for example, a CCD image sensor.

What is claimed is:

1. A solid-state imaging apparatus having a first pixel and a second pixel, comprising:
   a semiconductor substrate;

a first conductivity type semiconductor layer formed over the semiconductor substrate;

a first conductivity type first semiconductor layer formed over the semiconductor layer, the first semiconductor layer having a higher impurity concentration higher than the semiconductor layer;

a logic circuit region adjacent to a pixel region having the first pixel and the second pixel;

a device isolation region, including an isolation film formed over the first semiconductor layer, to provide device isolation between the pixel region and the logic circuit region;

and an anti-crosstalk arrangement including:

- a first anti-crosstalk well structure of a second conductivity type extending from one end in contact with the semiconductor substrate to another end in contact with a lower part of a first photodiode of the first pixel;
- a second anti-crosstalk well structure of the second conductivity type extending from one end in contact with the semiconductor substrate to another end in contact with a lower part of a second photodiode of the second pixel; and
- a third anti-crosstalk well structure of the second conductivity type extending from one end in contact with the semiconductor substrate to another end in contact with the isolation film.

2. A solid-state imaging apparatus according to claim 1, wherein each of the first anti-crosstalk well structure and the second anti-crosstalk well structure includes a ring-shaped lower portion in contact with the semiconductor substrate, and a plurality of dot-shaped portions extending upwardly from the ring-shaped lower portion and into contact with the lower part of the corresponding photodiode.

3. A solid-state imaging apparatus according to claim 1, wherein each of the first anti-crosstalk well structure and the second anti-crosstalk well structure includes a ring-shaped lower portion in contact with the semiconductor substrate, and a plurality of line-shaped portions extending upwardly from the ring-shaped lower portion and into contact with the lower part of the corresponding photodiode.

4. A solid-state imaging apparatus according to claim 1, wherein each of the first anti-crosstalk well structure and the second anti-crosstalk well structure includes a lower portion in contact with the semiconductor substrate and formed as a planar shape in accordance with a planar shape of the corresponding photodiode, and a plurality of dot-shaped portions extending upwardly from the planar-shaped lower portion and into contact with the lower part of the corresponding photodiode.

5. A solid-state imaging apparatus according to claim 1, wherein each of the first anti-crosstalk well structure and the second anti-crosstalk well structure includes a lower portion in contact with the semiconductor substrate and formed as a planar shape in accordance with a planar shape of the corresponding photodiode, and a plurality of line-shaped portions extending upwardly from the planar-shaped lower portion and into contact with the lower part of the corresponding photodiode.

6. The solid-state imaging apparatus according to claim 1, wherein anti-crosstalk arrangement further includes a fourth anti-crosstalk well structure of the second conductivity type extending from one end in contact with the semiconductor substrate to another end in contact with a lower part of a well of a transistor forming region of the pixel region.

* * * * *